(12) United States Patent
Zhou

(10) Patent No.: US 9,166,050 B2
(45) Date of Patent: Oct. 20, 2015

(54) TRANSISTOR AND METHOD FOR FORMING THE SAME

(71) Applicant: Semiconductor Manufacturing International (Shanghai) Corporation, Shanghai (CN)

(72) Inventor: Zuyuan Zhou, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/333,131

(22) Filed: Jul. 16, 2014

(65) Prior Publication Data

US 2015/0187941 A1    Jul. 2, 2015

(30) Foreign Application Priority Data

Dec. 30, 2013    (CN) .......................... 2013 1 0745717

(51) Int. Cl.

| | |
|---|---|
| *H01L 29/78* | (2006.01) |
| *H01L 29/66* | (2006.01) |
| *H01L 29/16* | (2006.01) |
| *H01L 29/165* | (2006.01) |
| *H01L 29/45* | (2006.01) |
| *H01L 29/49* | (2006.01) |
| *H01L 21/265* | (2006.01) |
| *H01L 21/324* | (2006.01) |
| *H01L 21/225* | (2006.01) |
| *H01L 21/306* | (2006.01) |
| *H01L 29/10* | (2006.01) |
| *H01L 21/02* | (2006.01) |

(52) U.S. Cl.
CPC ........ *H01L 29/7848* (2013.01); *H01L 21/2254* (2013.01); *H01L 21/26513* (2013.01); *H01L 21/30604* (2013.01); *H01L 21/324* (2013.01); *H01L 29/1054* (2013.01); *H01L 29/1083* (2013.01); *H01L 29/165* (2013.01); *H01L 29/1608* (2013.01); *H01L 29/456* (2013.01); *H01L 29/495* (2013.01); *H01L 29/665* (2013.01); *H01L 21/0262* (2013.01); *H01L 21/02529* (2013.01); *H01L 21/02636* (2013.01); *H01L 2924/13091* (2013.01)

(58) Field of Classification Search
CPC ............ H01L 29/7848; H01L 29/1054; H01L 29/1083; H01L 29/665; H01L 2924/13091; H01L 21/76841
USPC ................................... 257/384, 751; 438/300
See application file for complete search history.

(56) References Cited

U.S. PATENT DOCUMENTS

| | | | | |
|---|---|---|---|---|
| 7,608,515 | B2 * | 10/2009 | Chen et al. ..................... | 438/297 |
| 2007/0254421 | A1 * | 11/2007 | Tsai et al. ..................... | 438/197 |
| 2013/0316509 | A1 * | 11/2013 | Qin et al. ..................... | 438/289 |

* cited by examiner

*Primary Examiner* — Minh-Loan Tran
(74) *Attorney, Agent, or Firm* — Anova Law Group, PLLC

(57) ABSTRACT

Various embodiments provide transistors and methods for forming the same. In an exemplary method, a substrate can be provided. A gate structure can be formed on the substrate. A stress layer can be formed in the substrate on both sides of the gate structure. Barrier ions can be doped in the stress layer to form a barrier layer in the stress layer. The barrier layer can have a preset distance from a surface of the stress layer. An electrical contact layer can be formed using a portion of the stress layer on the barrier layer by a salicide process. The electrical contact layer can contain a first metal element. The first metal element can have a resistivity lower than a resistivity of a silicidation metal. The barrier layer can prevent atoms of the first metal element from diffusing to a bottom of the stress layer.

20 Claims, 7 Drawing Sheets

Region amorphized by Ge PAI

Suppression of Al diffusion in the presence of C

C along NiSi grain boundaries could further retard Al diffusion during silicidation

US 9,166,050 B2

TRANSISTOR AND METHOD FOR FORMING THE SAME

CROSS-REFERENCES TO RELATED APPLICATIONS

This application claims priority to Chinese Patent Application No. CN201310745717.4, filed on Dec. 30, 2013, the entire contents of which are incorporated herein by reference.

FIELD OF THE DISCLOSURE

The present disclosure relates to the field of semiconductor fabrication technology and, more particularly, relates to transistors and methods for forming the same.

BACKGROUND

With rapid development of semiconductor fabrication technology, semiconductor devices are being developed toward a direction of higher component density and higher degree of integration. As the most basic semiconductor device, transistor is widely used nowadays. Therefore, with the increase of component density and degree of integration of semiconductor devices, the gate size of a transistor is becoming smaller than before. However, when the gate size of the transistor becomes smaller, short-channel effect can occur in the transistor and leakage current can thus be generated. Electrical properties of the semiconductor device can eventually be affected.

Conventionally, performance of semiconductor devices is mainly improved by increasing carrier mobility. When the carrier mobility is increased, the drive current in a transistor is increased, and the leakage current in the transistor is accordingly decreased. A key element to improve the carrier mobility is to increase stress in the channel region of the transistor. Thus, increasing the stress in the channel region of the transistor can improve the performance of the transistor.

An existing method to improve the stress of the channel region of a transistor is as follows. A stress layer is formed in the source region and the drain region of the transistor. The stress layer of a P-type metal-oxide-semiconductor (PMOS) transistor is made of silicon-germanium (SiGe). Because SiGe and silicon have the same crystal structure, i.e., a "diamond" structure, and the lattice constant of SiGe is greater than the lattice constant of silicon at room temperature, a lattice mismatch thus exists between the silicon and the SiGe. Therefore, the stress layer can provide a compressive stress in the channel region, and accordingly improve the performance of the carrier mobility in the channel region of the PMOS transistor. Correspondingly, the stress layer of an N-type metal-oxide-semiconductor (NMOS) transistor is made of silicon carbide (SiC). Because the lattice constant of SiC is smaller than the lattice constant of silicon at room temperature, a lattice mismatch thus exists between the silicon and the SiC. Therefore, the stress layer can provide a tensile stress in the channel region, and accordingly improve the performance of the NMOS transistor.

FIG. 1 depicts a cross-sectional view of an existing transistor with a stress layer. As shown in FIG. 1, the transistor includes a substrate 100, a gate structure 101 on the surface of the substrate 100, and stress layers 102 in the substrate 100 at both sides of the gate structure 101. The sidewall of the stress layer 102 has an angle (i.e., a vertex angle). The angle extends toward within the substrate 100 at the bottom of the gate structure 101. The sidewall of the stress layer 102 has a "Σ" shape with respect to the surface of the substrate 100.

The transistor further includes a source region and a drain region (not shown) within the stress layer 102 and the substrate 100 at both sides of the gate structure 101. The transistor further includes conductive plugs 103 on the surface of the stress layers 102, to be electrically connected to the source region and the drain region. When the transistor is a PMOS transistor, the stress layer 102 is made of SiGe. When the transistor is an NMOS transistor, the stress layer 102 is made of SiC.

However, in such existing transistor having a stress layer, the improvement of the carrier mobility in the channel region is still limited. Thus, the capacity of the transistor for suppressing leakage current is limited. The disclosed methods and structures are directed to solve one or more problems set forth above and other problems.

BRIEF SUMMARY OF THE DISCLOSURE

One aspect of the present disclosure includes methods for forming a transistor. In an exemplary method, a substrate can be provided. A gate structure can be formed on the substrate. A stress layer can be formed in the substrate on both sides of the gate structure. Barrier ions can be doped in the stress layer to form a barrier layer in the stress layer. The barrier layer can have a preset distance from a surface of the stress layer. An electrical contact layer can be formed using a portion of the stress layer on the barrier layer by a salicide process. The electrical contact layer can contain a first metal element. The first metal element can have a resistivity lower than a resistivity of a silicidation metal. The barrier layer can prevent atoms of the first metal element from diffusing to a bottom of the stress layer.

Another aspect of the present disclosure includes transistors. An exemplary transistor can include a substrate, a gate structure on the substrate, and a stress layer in the substrate on both sides of the gate structure. Further, the transistor can include a barrier layer in the stress layer. The barrier layer can include doped barrier ions. The barrier layer can have a preset distance from a surface of the stress layer. Further, the transistor can include an electrical contact layer formed using a portion of the stress layer on the barrier layer by a salicide process. The electrical contact layer can contain a first metal element. The first metal element can have a resistivity lower than a resistivity of a silicidation metal. The barrier layer can prevent atoms of the first metal element from diffusing to a bottom of the stress layer.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
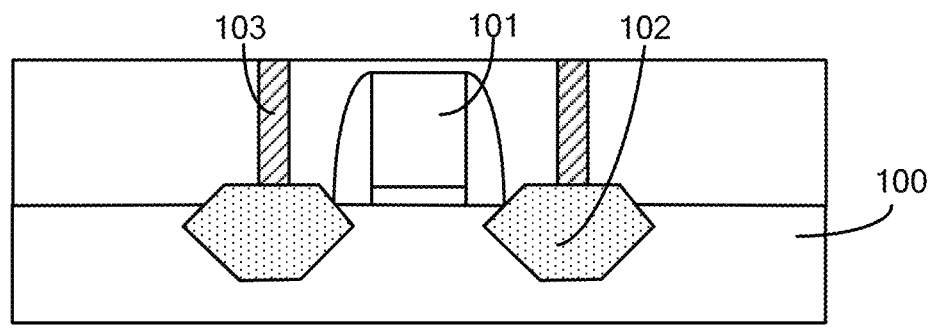
FIG. 1 depicts a cross-sectional view of an existing transistor with a stress layer.

As described, in an existing transistor having a stress layer described in FIG. 1, improvement of carrier mobility in the channel region is limited. Therefore, the capacity of the transistor for suppressing leakage current is limited.

Referring to FIG. 1, a stress layer 102 is made of a material having a lattice structure. Therefore, there can be lattice space in the stress layer 102. The lattice space can refer to vacant space in the lattice that can be interstitial sites for trapping impurity ions or atoms.

For example, in an NMOS transistor, the stress layer 102 can be made of SiC. The SiC can have a relatively small lattice constant. That is, the stress layer 102 has a relatively small crystal lattice size, and a relatively large lattice space. Due to the relatively large lattice space, the stress layer 102 can provide lattice interstitial sites. The lattice interstitial sites can trap N-type or P-type dopant ions of the source region or the drain region. As a result, after the dopant ions in the source region and the drain region are activated, the amount of activated dopant ions can be reduced.

When the amount of the activated dopant ions is reduced, the resistance of the source region and the drain region can be increased. In particular, the contact resistance of the contact interface between the stress layer 102 and the conductive plug 103 can be increased. The increase of the contact resistance can (relatively) reduce the resistance between the source region and the drain region, and can accordingly offset the action and effect of the stress provided for the channel region by the stress layer 102.

Thus, in an existing transistor having a stress layer, improvement of carrier mobility in the channel region is limited. Therefore, in the channel region of the transistor having the stress layer, the improvement of carrier mobility is limited and the capacity for suppressing leakage current is limited.

The disclosed embodiments provide methods and structures for forming an enhanced transistor. According to the disclosed embodiments, prior to forming an electrical contact layer using a salicide process, barrier ions can be doped in a stress layer, thereby forming a barrier layer within the stress layer. The barrier layer can prevent atoms that are subsequently used for forming the electrical contact layer from diffusing toward the bottom of the stress layer.

The electrical contact layer can be made of a material containing a first metal element. The resistivity of the first metal element can be lower than the resistivity of a silicidation metal. For example, when the silicidation metal is nickel (i.e., nickel element) or cobalt (i.e., cobalt element), the resistivity of the first metal element can be lower than the resistivity of nickel or cobalt. Thus, the resistivity of the formed electrical contact layer can be reduced, and the current between the source region and the drain region of the formed transistor can be increased. Accordingly, the carrier mobility in the channel region can be improved, and leakage current can be reduced.

As used herein, unless otherwise specified, resistivity refers to electrical resistivity. The silicidation metal refers to any appropriate metal that forms a silicide with silicon via a silicide or salicide process. For example, the silicidation metal can be titanium, cobalt, nickel, platinum, and/or tungsten. In various embodiments, during a silicide process, a metal film containing the silicidation metal can be deposited on the stress layer. The atoms of the silicidation metal can then react with the silicon in the stress layer to form an electrical contact layer that contains the silicide.

However, when the resistivity of the first metal element is lower than the resistivity of nickel or cobalt, the first metal element can have a relatively strong activity. In a high-temperature environment, the first metal element tends to diffuse in the stress layer. The barrier layer can prevent atoms of the first metal element from diffusing toward the bottom of the stress layer. Thus, the atoms of the first metal element can be concentrated in the portion of the stress layer higher than (i.e., above) the barrier layer.

Therefore, the formed electrical contact layer can be located on the surface of the barrier layer. That is, the barrier layer can define both the thickness of the barrier layer and the thickness of electrical contact layer. The barrier layer can prevent the atoms of the first metal element from diffusing, and can ensure that the electrical contact layer can have a relatively low resistance. In addition, the formed electrical contact layer can have a uniform thickness, and the thickness can be controlled precisely and accurately, which can be beneficial for improving the carrier mobility in the channel region and reducing electrical leakage. The performance of the formed transistor can thus be improved.

Figure 8:
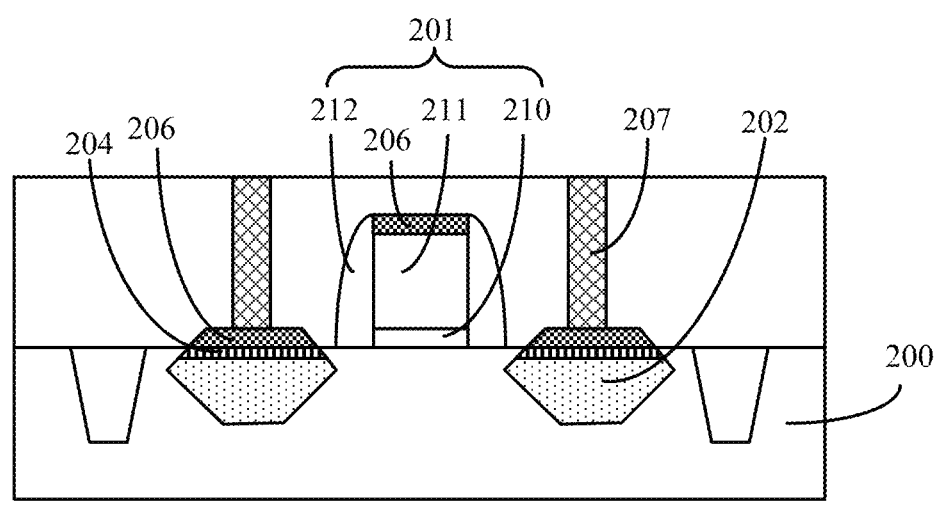
Figure 9:
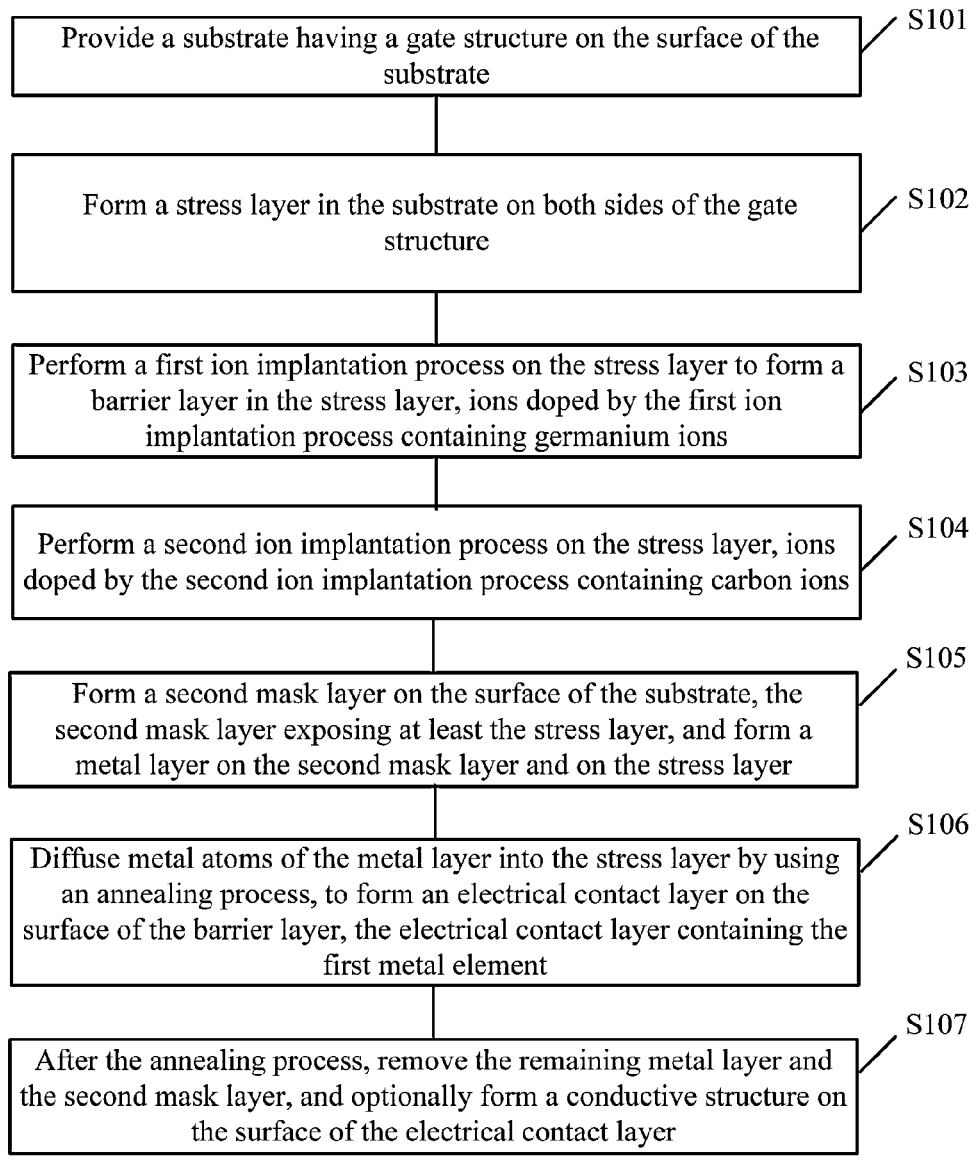
FIG. 9 depicts a flow diagram of an exemplary method for forming a transistor in accordance with various disclosed embodiments.

FIG. 9 depicts a flow diagram of an exemplary method for forming a transistor in accordance with various disclosed embodiments. FIGS. 2-8 depict cross-sectional views of the transistor at various stages during a fabrication process in accordance with various disclosed embodiments. Note that although FIGS. 2-8 depict semiconductor structures corresponding to the method depicted in FIG. 9, the semiconductor structures and the method are not limited to one another in any manner.

Figure 2:
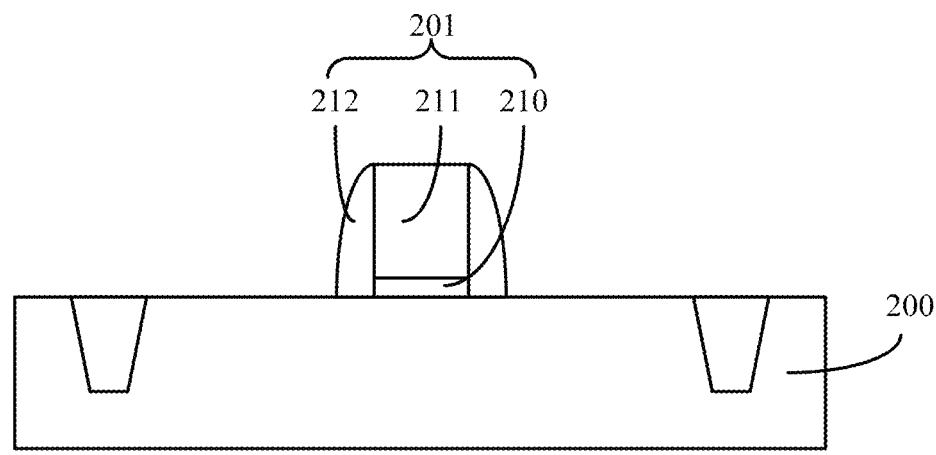
FIGS. 2-8 depict cross-sectional views of an exemplary transistor at various stages during a fabrication process in accordance with various disclosed embodiments.

In Step S101 of FIG. 9 and referring to FIG. 2, a substrate 200 is provided. A gate structure 201 is formed on the surface of the substrate 200. The substrate 200 can provide a working platform for subsequent processes.

The substrate 200 can be, e.g., a silicon substrate, a germanium (Ge) substrate, a SiGe substrate, a SiC substrate, a silicon-on-insulator substrate, and/or a germanium-on-insulator substrate. In one embodiment, the substrate 200 can be a silicon substrate.

When a subsequently-formed transistor is an NMOS transistor, a subsequently-formed stress layer can be made of a material containing SiC. A lattice mismatch may be needed between the stress layer and the substrate 200, such that the stress layer can provide stress for a channel region at the bottom of a gate electrode layer 211.

In one embodiment, because the SiC has a relatively large lattice space, when an electrical contact layer is subsequently formed using a self-aligned silicide process, metal atoms of a metal layer may easily diffuse toward within the stress layer (e.g., toward the bottom of the stress layer), resulting in poor electrical performance of the stress layer and the electrical contact layer. Thus, stability and reliability of the formed transistor can become poor. Therefore, in one embodiment, prior to forming the electrical contact layer, a barrier layer can be formed in the stress layer to prevent the metal atoms from diffusing to the bottom of the stress layer, in order to improve the performance of the electrical contact layer and the stress layer.

In one embodiment, the substrate 200 can be made of a material containing SiGe. The subsequently-formed transistor can be an NMOS transistor. The subsequent-formed stress layer can be made of a material containing silicon.

In another embodiment, the subsequently-formed transistor can be a PMOS transistor. When the substrate 200 is made of a material containing silicon, the stress layer can be made of a material containing SiGe. When the substrate 200 is made of a material containing SiC, the stress layer can be made of a material containing silicon.

The gate structure 201 can include a gate dielectric layer 210 on the surface of the substrate 200, a gate electrode layer 211 on the surface of the gate dielectric layer 210, and sidewall spacers 212 on the sidewalls of both the gate electrode layer 211 and the gate dielectric layer 210 and on the surface of the substrate 200.

In one embodiment, the gate structure 201 can be used for forming an NMOS transistor. The substrate 200 can be used for forming a region of the NMOS transistor, and isolating the region of the NMOS transistor from other regions via a shallow trench isolation structure (not labeled).

In one embodiment, in order for the subsequently-formed stress layer to provide greater stress for the substrate 200 at the bottom of the gate electrode layer 211 and the gate structure 201, a sidewall of the formed stress layer can extend toward within the substrate 200 at the bottom of the gate electrode layer 211 and the gate structure 201.

A sidewall of the stress layer can have a "Σ" shape relative to the surface of the substrate 200. Therefore, the crystal orientation of the surface of the substrate 200 can be <100> or <110>, such that, when an opening used for forming the stress layer is subsequently formed, a sidewall of the opening can have a "Σ" shape via an anisotropic wet etching process.

For example, the gate dielectric layer 210 can be made of a material containing silicon oxide. The gate electrode layer 211 can be made of a material containing polysilicon. The sidewall spacers 212 can be made of a material containing silicon oxide, silicon nitride, silicon oxynitride, or a combination thereof. The sidewall spacers 212 can be used for protecting the sidewall of the gate electrode layer 211 and the gate dielectric layer 210. In addition, the sidewall spacers 212 can define the position(s) of the subsequently-formed stress layer, the source region and the drain region.

For example, a process for forming the gate electrode layer 211 and the gate dielectric layer 210 can include the following steps. A gate dielectric film can be formed on the surface of the substrate 200. A gate electrode film can be deposited on the surface of the gate dielectric film. A portion of both of the gate electrode film and the gate dielectric film can be removed using a photolithography process and an etching process, until the surface of the substrate 200 is exposed, to form the gate electrode layer 211 and the gate dielectric layer 210. A process for forming the gate dielectric film can include, e.g., a deposition process, and/or an oxidation process.

For example, a process for forming the sidewall spacers 212 can include the following steps. A sidewall spacer film can be deposited on the surface of the gate electrode layer 211 and the gate dielectric layer 210. The sidewall spacer film can be etched using an etch-back process, until the surface of the gate electrode layer 211 is exposed, to form the sidewall spacers 212.

In one embodiment, the gate dielectric layer 210 and the gate electrode layer 211 can be used for subsequently forming a transistor. In another embodiment, a subsequently-formed transistor is a high-K metal gate (HKMG) transistor. In this case, after the electrical contact layer is subsequently formed, a gate last process can be performed, to remove the gate electrode layer 211 and the gate dielectric layer 210. The gate dielectric layer 210 can be replaced with a high-K gate dielectric layer. The gate electrode layer 211 can be replaced with a metal gate.

Figure 3:
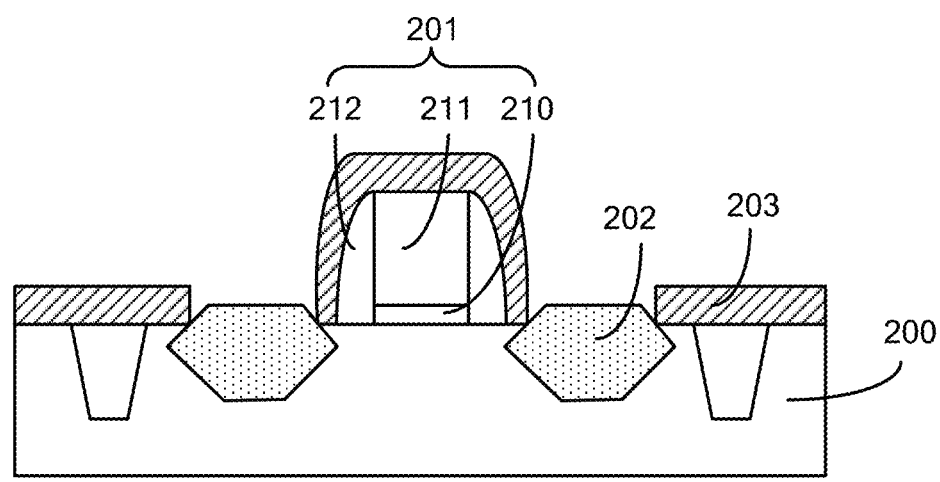

In Step S102 of FIG. 9 and referring to FIG. 3, stress layer(s) 202 are formed in the substrate 200 on both sides of the gate structure 201. In one embodiment, the formed transistor is an NMOS transistor, and the substrate 200 is made of silicon. In this case, in order to provide a tensile stress for the channel region of the NMOS transistor, the stress layer 202 can be made of SiC.

For example, a process for forming the stress layers 202 can include the following steps. A first mask layer 203 can be formed on the surface of the substrate 200 and the surface of the gate structure 201. The first mask layer 203 can expose the portion of the surface of the substrate 200 at both sides of the gate structure 201. The substrate 200 can be etched using the first mask layer 203 as an etching mask, to form openings (not shown) in the substrate 200. The stress layers 202 can be formed within the openings by a selective epitaxial deposition process. The first mask layer 203 can define the positions of the openings. The first mask material layer 203 can be made of a material containing, e.g., silicon nitride.

In one embodiment, the sidewall(s) of the opening and the surface of the substrate 200 can form a "Σ" (Sigma) shape. The sidewall of the opening can have an angle (i.e., a vertex angle). The angle can extend toward within the substrate 200 at the bottom of the gate structure 201.

For example, a process for forming the opening can include the following steps. The substrate 200 can be etched by using an anisotropic dry etching process and using the first mask layer 203 as an etching mask, to form an opening in the substrate 200. The sidewall(s) of the opening can be perpendicular to the surface of the substrate 200. After the anisotropic dry etching process, using the first mask layer 203 as an etching mask, the sidewall(s) and the bottom of the opening can be etched using an anisotropic wet etching process, to cause the sidewall(s) of the opening and the surface of the substrate 200 to form a "Σ" shape. The distance from the stress layer 202 formed within the opening to the gate structure 201 can be relatively small. Thus, the channel region at the bottom of gate structure 201 can obtain greater stress, which can help to improve the carrier mobility and to improve the performance of the formed transistor.

The anisotropic dry etching process can use an etching gas containing, e.g., chlorine, hydrogen bromide, or a mixed gas of chlorine and hydrogen bromide. The hydrogen bromide can have a flow rate ranging from about 200 standard cubic centimeters per minute (sccm) to about 800 sccm. The chlorine can have a flow rate ranging from about 20 sccm to about 100 sccm. The etching gas can further contain an inert gas having a flow rate ranging from about 50 sccm to about 1000 sccm. The etching chamber can have a pressure ranging from about 2 mTorr to about 200 mTorr. The etching time can range from about 15 seconds to about 60 seconds.

The anisotropic wet etching process can use an etching solution that is, e.g., a basic solution. The basic solution can contain potassium hydroxide (KOH), sodium hydroxide (NaOH), lithium hydroxide (LiOH), ammonia (NH$_4$OH), tetramethyl ammonium hydroxide (TMAH), or a combination thereof.

In one embodiment, the substrate of the surface 200 can have a crystal orientation of <100> or <110>. The anisotropic wet etching process can have a relatively high etching rate in the directions perpendicular to and parallel to the surface of the substrate, and can have the slowest etching rate in the direction of crystal orientation <111>. Therefore, the sidewall of the formed opening and the surface of the substrate 200 can form the "Σ" shape. That is, the sidewall of the formed opening can form the "Σ" shape with the surface of the substrate 200.

In another embodiment, the sidewalls of the opening can be perpendicular to the surface of the substrate 200. The process of forming the openings can include the anisotropic dry etching process. Thus, the process of forming the openings can be simple, and process time and cost can be saved.

The stress layer 202 can be used for providing stress for the channel region at the bottom of the gate structure 201, to improve the carrier mobility in the channel region. In one embodiment, the substrate 200 can be a silicon substrate. The formed transistor can be an NMOS transistor. The stress layer 202 can be made of a material containing SiC. Further, the process for forming the stress layer 202 can include, e.g., a selective epitaxial deposition, such that there can be a lattice mismatch between SiC and silicon.

In one embodiment, the stress layer 202 can be made of SiC. The process of forming the stress layer 202 can be a selective epitaxial deposition process.

The selective epitaxial deposition process can have a temperature ranging from about 500° C. to about 800° C., and a pressure ranging from about 1 Torr to about 100 Torr. The selective epitaxial deposition process can have a deposition gas containing a silicon source gas (e.g., $SiH_4$, or $SiH_2Cl_2$) and a carbon source gas (e.g., $CH_4$, $CH_3Cl$, or $CH_2Cl_2$). The silicon source gas and/or the carbon source gas can have a flow rate ranging from about 1 sccm to about 1000 sccm.

Alternatively, the total flow rate of the silicon source gas and the carbon source gas can range from about 1 sccm to about 1000 sccm. Further, the selective epitaxial deposition process can have a gas containing HCl and/or $H_2$. The HCl can have a flow rate ranging from about 1 sccm to about 1000 sccm. The $H_2$ can have a flow rate ranging from about 0.1 sccm to about 50 sccm, or from about 0.1 standard liter per minute (slm) to about 50 slm.

In one embodiment, during the forming of the stress layer 202 using the deposition process using the selective epitaxial process, a source region and/or a drain region can be formed in the stress layer 202 by an in situ doping process. In one embodiment, a transistor that is formed can be an NMOS transistor. In this case, the doped ions can contain N-type ions, e.g., phosphorus ions, arsenic ions, and/or other appropriate N-type ions.

The in-situ doping process can regulate dopant-ion distribution and dopant-ion concentration in the source region and/or the drain region, in order to prevent the dopant ions from diffusing and thus suppress the short-channel effect. Furthermore, the ions doped in the stress layer 202 by the in-situ doping process can further contain one or both of nitrogen ions and carbon ions.

The doping concentration of nitrogen ions, the doping concentration of carbon ions, or the total doping concentration of nitrogen ions and carbon ions can range from about $1E18$ atoms/cm$^3$ to about $3E19$ atoms/cm$^3$. The doped nitrogen ions or carbon ions can be used for regulating the N-type dopant-ion concentration in the source region and/or the drain region in order to prevent the short-channel effect, according to the specific process.

In another embodiment, after the stress layer 202 is formed, a source region and a drain region (not shown) can be formed in the stress layers 202 on both sides of the gate structure 201 and in the portion of the substrate 200 on both sides of the gate structure 201, by using an ion implantation process. The dopant ions that are implanted can contain N-type ions.

After the source region and the drain region are formed, barrier ions can be doped in the stress layer 202 by subsequent process(es), to form a barrier layer. The barrier layer can have a preset distance from the surface of the stress layer 202. That is, in various embodiments, there can be a preset distance between the barrier layer and the top surface of the stress layer 202. In one embodiment, the doped barrier ions can contain germanium ions and carbon ions. A process of forming the doped barrier layer can be detailed as follows.

Figure 4:
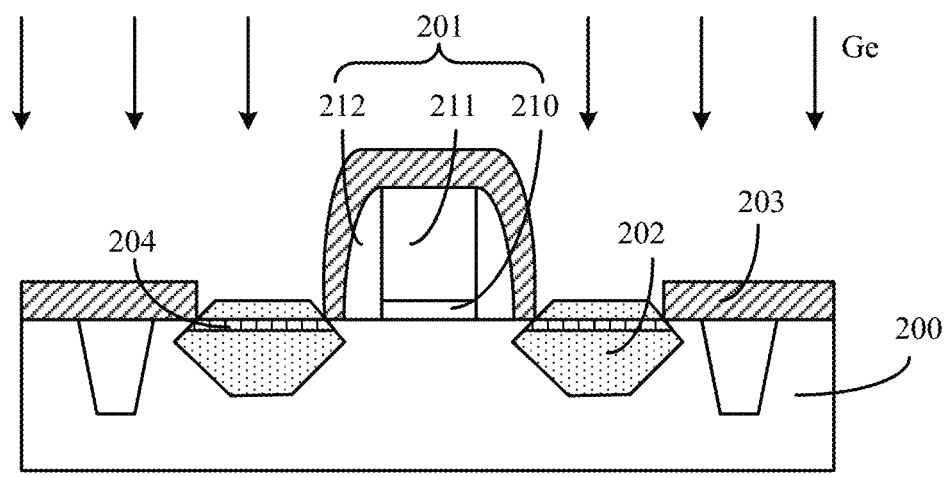

In Step S103 of FIG. 9 and referring to FIG. 4, optionally, a first ion implantation process can be performed on the stress layer 202, to form a barrier layer 204 in the stress layer 202. The ions doped by the first ion implantation process can contain germanium ions. The implantation depth of the germanium ions can be a preset depth. Thus, when the ions doped by the first ion implantation process contain germanium ions, the first ion implantation process can also be referred to as a germanium-containing ion implantation process.

A process for forming the barrier layer 204 can include a first ion implantation process and a second ion implantation process. The first ion implantation process can be used for implanting germanium ions in the stress layer 202. The second ion implantation process can be used for implanting carbon ions in the stress layer 202. Thus, when the ions doped by the second ion implantation process contain carbon ions, the second ion implantation process can also be referred to as a carbon-containing ion implantation process.

In one embodiment, after the first ion implantation process is performed on the stress layer 202, the second ion implantation process can be subsequent performed. In another embodiment, after the second ion implantation process is performed on the stress layer 202, the first ion implantation process can be subsequent performed. In yet another embodiment, the first ion implantation process and the second ion implantation process can be performed simultaneously. In other words, as used herein, relational terms such as 'first' and 'second' in 'first ion implantation process' and 'second ion implantation process' are merely used for differentiate one process from another process, and do not require or imply that any actual order as such exist between these processes.

The first ion implantation process can include a pre-amorphization implant (PAI) process. The ions that are implanted can be germanium ions. Thus, a barrier layer that is eventually formed can contain germanium ions. For example, the first ion implantation process can have parameters including an implantation energy ranging from about 2 KeV to about 20 KeV, a doping concentration ranging from about $1E14$ atoms/cm$^3$ to about $5E15$ atoms/cm$^3$, and an implantation angle perpendicular to the surface of the substrate 200.

In various embodiments, the first ion implantation process can be a pre-amorphization implant process and can thus cause the surface of the formed barrier layer 204 to be amorphous. The portion of the barrier layer 204 that is amorphous can be referred to as an amorphous layer or an amorphous germanium layer.

The implantation depth of the germanium ions can be controlled by controlling the parameters of the first ion implantation process, such that the thickness of the amorphous layer can be adapted to the preset distance between the barrier layer 204 and the top surface of the stress layer 202. That is, the thickness of the amorphous layer can be controlled in order to result in a distance between the barrier layer 204 and the top surface of the stress layer 202 equal to the preset distance. Further, the region between the surface of the barrier layer 204 and the top of the stress layer 202 can be subsequently used for forming an electrical contact layer. Therefore, the thickness of the electrical contact layer can be precisely controlled, and the electrical properties of the formed electrical contact layer can be improved.

In the formed barrier layer 204, germanium atoms can have a relatively large size, such that an amorphous region, i.e., the amorphous layer, can be formed at the surface of the barrier layer 204. Subsequently, in a self-aligned silicide (i.e., salicide) process, a metal layer can be formed on the surface of the stress layer 202. Metal atoms in the metal layer can form a silicide mainly in the amorphous region, or near the amorphous region. The metal atoms can have a uniform diffusion speed at the location of the barrier layer 204, such that the contact interface between the subsequently-formed electrical contact layer and the stress layer 202 can be smooth and uniform. In addition, the thickness of the electrical contact layer can be controlled, such that the contact interface between the subsequently-formed electrical contact layer and the stress layer 202 can have stable electrical properties.

The contact interface between the subsequently-formed electrical contact layer and the stress layer 202 can be the contact interface between the subsequently-formed electrical contact layer and the barrier layer 204. Depending on the specific microscopic structure formed by various processes, at the contact interface, a certain amount of the metal atoms of the metal layer for forming the silicide may diffuse into the barrier layer, and the carbon atoms of the barrier layer 204 may diffuse into the electrical contact layer.

Although a pre-amorphization implant process is used in certain embodiments, any other appropriate process can be used in order to form the barrier layer 204, such that the metal atoms can have a uniform diffusion speed at the location of the barrier layer 204 and the contact interface between the subsequently-formed electrical contact layer and the stress layer 202 can be smooth and uniform.

Figure 5:
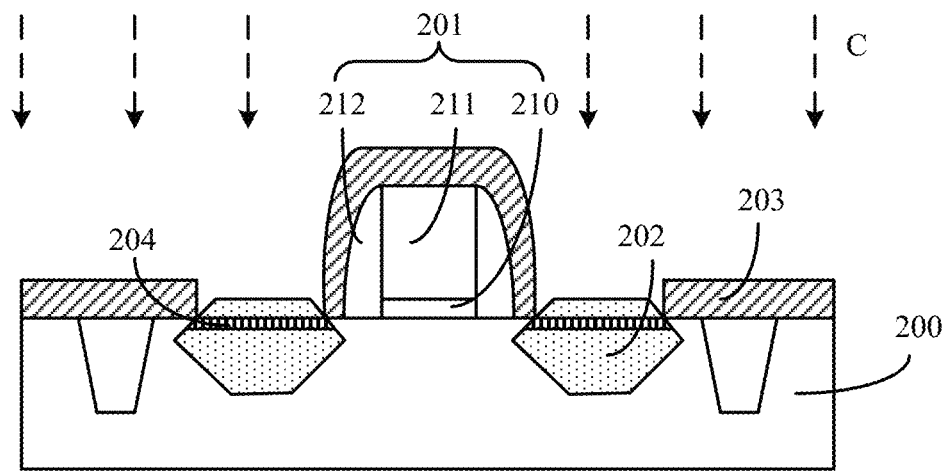

In Step S104 of FIG. 9 and referring to FIG. 5, after the first ion implantation process, the second ion implantation process is performed on the stress layer 202. The ions doped by the second ion implantation process can be carbon ions. The implantation depth of the carbon ions can be the preset depth.

In one embodiment, the second ion implantation process can be performed after the first ion implantation process. The implanted ions can be carbon ions. In addition, the implantation depth of the second ion implantation process can be similar to the implantation depth of the first ion implantation process. That is, the carbon ions can be implanted in the barrier layer 204, such that the barrier ions in the barrier layer 204 can further include the carbon ions. In another embodiment, the first ion implantation process can be performed after the second ion implantation process. In yet another embodiment, the first ion implantation process and the second ion implantation process can be performed simultaneously.

The ions implanted by the second ion implantation process can be carbon ions. Thus, the barrier layer 204 that is formed can contain the carbon ions. The second ion implantation process can have parameters including an implantation energy ranging from about 1 KeV to about 10 KeV, a doping concentration ranging from about 1E14 atoms/cm$^3$ to about 5E15 atoms/cm$^3$, and an implantation angle perpendicular to the surface of the substrate 200.

The second ion implantation process can further dope carbon ions in the amorphous region at the surface of the barrier layer 204. In addition, by controlling the parameters of the second ion implantation process, the implantation depth of the carbon ions can be controlled, such that the implantation depth of the carbon ions can be adapted to the preset distance between the barrier layer 204 and the top surface of the stress layer 202. Therefore, the location of the formed barrier layer 204 can be controlled by the first ion implantation process and the second ion implantation process. The region between the surface of the barrier layer 204 and the top of the stress layer 202 can be subsequently used for forming an electrical contact layer. Therefore, the thickness of the electrical contact layer can be precisely controlled, and the electrical properties of the formed electrical contact layer can be improved.

The preset depth can be adjusted according to specific technical requirements. Further, the parameters of the first ion implantation process and of the second ion implantation process can be adjusted according to the preset depth, in order to adjust the implantation depth of the germanium ions and the implantation depth of the carbon ions.

In various embodiments, carbon ions can be doped in the formed barrier layer 204. Because particle size of the carbon ions is relatively small, the carbon ions can fill in the lattice space in the stress layer 202. During a subsequent salicide process, a metal layer can be formed on the surface of the stress layer 202. Metal atoms having a relatively small atomic size in the metal layer can be blocked by the carbon atoms. Thus, metal atoms having a relatively small atomic size, e.g., aluminum (Al) atoms can be prevented from diffusing to the bottom of the stress layer 202 via the barrier layer 204, in order to ensure stable performance of the stress layer 202.

Moreover, because the barrier layer 204 can block the passing of the metal atoms that have a small atomic size, a greater variety of metal elements can be mixed in the subsequently-formed metal layer, without the problem of metal diffusion. Thus, the resistivity of the formed electrical contact layer can be reduced. The current between the source region and the drain region of the transistor can be increased, and leakage current can be reduced. Further, because the barrier layer 204 can block the passing of the metal atoms, the metal atoms of the metal layer can be concentrated in the region between the surface (i.e., top surface) of the barrier layer 204 and the top surface of the stress layer 202. Thus, the resistivity of the formed electrical contact layer can be reduced.

After the second ion implantation process, the first mask layer 203 can be removed. An electrical contact layer can be formed in the portion of the stress layer 202 on the surface of the barrier layer, using a self-aligned silicide process. The process for forming the electrical contact layer is detailed as follows.

Figure 6:
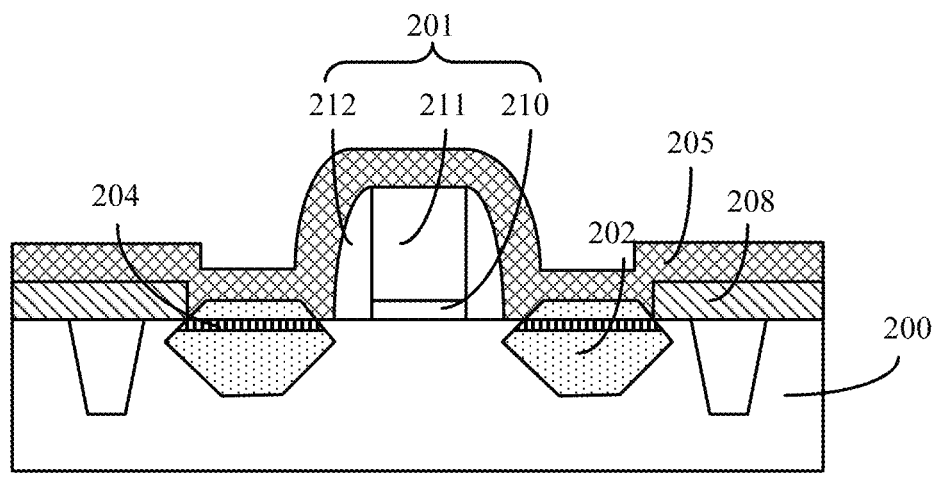

In Step S105 of FIG. 9 and referring to FIG. 6, a second mask layer 208 is formed in the surface of the substrate 200. The second mask layer 208 exposes at least the surface of the stress layer 202. A metal layer 205 can be formed on the surface of the second mask layer 208 and on the surface of the stress layer 202.

The second mask layer 208 can expose corresponding location(s) for forming an electrical contact layer. In one embodiment, the second mask layer 208 can expose the surface of the stress layer 202 and the surface of the gate structure 201. Because the gate electrode layer 211 is exposed at the top of the gate structure 201 and the sidewalls of the gate structure 201 are protected by the sidewall spacers 212, an electrical contact layer can also be formed at the top surface of the gate electrode layer 211 in a subsequent process. The electrical contact layer can be used for electrically connecting to a subsequently-formed conductive structure, to accomplish the electrical connection of the source region, the drain region, or the gate electrode layer 211 with an external circuit, and further to reduce the contact resistance between the conductive structure and the source region, the drain region, or the gate electrode layer 211.

The second mask layer 208 can be made of a material containing silicon oxide, silicon nitride, silicon oxynitride, or a combination thereof. For example, a process for forming the second mask layer 208 can include the follow steps. A mask film can be deposited on the surface of the substrate 200, the surface of the stress layer 202, and the surface of the gate structure 201. A patterned photoresist layer can be formed on the surface of the mask film. The mask film can be etched using the photoresist layer as an etching mask, until the substrate 200, the stress layer 202, and/or the gate structure 201 are exposed. After the process of etching the mask film, the photoresist layer can be removed.

In one embodiment, the metal layer 205 can be made of a material containing a first metal element. The resistivity of the first metal element can be lower than the resistivity of nickel element or cobalt element. Thus, the resistivity of the formed electrical contact layer can be reduced, and the performance of the formed transistor can be improved. In one embodiment, the first metal element can be copper, tungsten, aluminum, and/or any other appropriate element. Copper, tungsten, or aluminum has a relatively low resistivity. Further, the metal layer 205 can be made a material containing one or both of nickel element and cobalt element.

In one embodiment, the first metal element can be aluminum. The metal layer 205 can further contain nickel element. In this case, aluminum atoms in the metal layer 205 can have an atomic percent concentration ranging from about 0.01% to about 1%. Because aluminum atoms have a relatively strong activity and a relatively poor stability in a high-temperature environment, and can move in the space in the lattice in the stress layer 202, the aluminum atoms tend to diffuse in the stress layer 202.

However, in one embodiment, the barrier layer 204 can be formed in the stress layer 202. The barrier layer 204 can prevent the aluminum atoms from passing, and can thus reduce the resistivity of the electrical contact layer and ensure the stability of the electrical properties of the stress layer 202. At the same time, the barrier layer 204 can make the nickel atoms diffuse to the bottom of the stress layer 202 at a uniform speed. Thus, the contact interface between the formed electrical contact layer and the stress layer 202 can be smooth, and electrical properties of the electrical contact layer can be stable.

Figure 7:
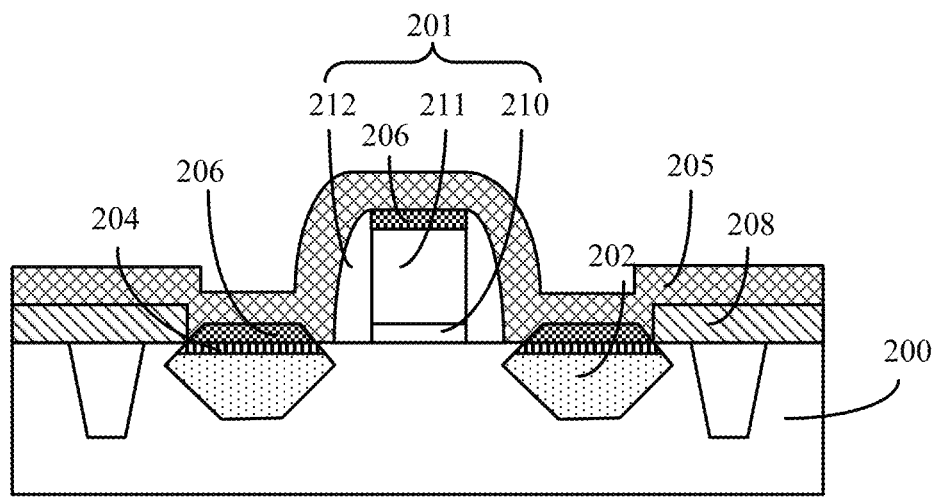

In Step S106 of FIG. 9 and referring to FIG. 7, metal atoms in the metal layer 205 are caused to diffuse toward (i.e., diffuse into) the stress layer 202 by using an annealing process, to form an electrical contact layer 206 on the surface of the barrier layer 204. The electrical contact layer 206 can contain the first metal element.

The annealing process can include rapid thermal annealing, spike annealing (i.e., spike thermal annealing), and/or laser thermal annealing. For example, when rapid thermal annealing is being used, the rapid thermal annealing can have a temperature ranging from about 200° C. to about 500° C., a time (i.e., an annealing time) ranging from about 10 seconds to about 120 seconds, and a protective gas containing nitrogen and/or inert gas. When spike annealing is being used, the spike annealing can have a temperature ranging from about 300° C. to about 600° C., and a protective gas containing nitrogen and/or an inert gas. When laser thermal annealing is being used, the laser thermal annealing can have a temperature ranging from about 500° C. to about 900° C., an annealing time ranging from about 0.1 ms to about 2 ms, and a protective gas containing nitrogen and/or an inert gas.

The formed electrical contact layer 206 can be made of a material containing a metal silicide. The thickness of the electrical contact layer 206 can increase with the increase of the annealing time. The annealing process can drive the metal atoms in the metal layer 205 to enter the stress layer 202, to cause the top region of the stress layer 202 to be transformed into a metal silicide, and form the electrical contact layer 206.

In one embodiment, the first metal element in the metal layer 205 can be aluminum. In addition, the metal layer 205 can further contain nickel element. The formed electrical contact layer 206 can be made of a material containing Ni(Al)Si.

In another embodiment, the first metal element in the metal layer 205 is aluminum. In addition, the metal layer 205 can further contain cobalt element. The formed electrical contact layer 206 can be made of a material containing Co(Al)Si. Alternatively, the metal layer 205 can contain nickel element and cobalt element. The formed electrical contact layer 206 can be made of a material containing Ni(Al)Si mixed with Co(Al)Si. Although nickel and cobalt are depicted, other appropriate elements may be contained in the metal layer 205 to form a silicide for forming the electrical contact layer 206.

Aluminum atoms can have a relatively strong activity, and tend to diffuse in the stress layer 202. However, the barrier layer 204 can be formed in the stress layer 202. The barrier layer 204 can be doped with carbon (C) ions. The carbon ions can fill in the space in the lattice in the stress layer 202. The carbon ions can block the passing of the aluminum atoms, and thus prevent the aluminum atoms from diffusing to the bottom of the stress layer 202. Accordingly, the aluminum atoms can be concentrated in the region between the surface of the barrier layer 204 and the top surface of the stress layer 202, such that the resistivity of the formed electrical contact layer 206 can be reduced. That is, the contact resistance between the stress layer 202 and the subsequently-formed conductive structure can be reduced.

Moreover, the barrier layer 204 can further contain the amorphous germanium layer formed in the substrate 200 using the first ion implantation process. The amorphous germanium layer can define the moving distance of the cobalt atoms or the nickel atoms, such that the moving speed (i.e., diffusion speed) of the nickel atoms or the cobalt atoms moving toward the bottom of the stress layer 202 can be uniform. Thus, the thickness of the formed electrical contact layer 206 can be uniform. Further, the contact interface between the electrical contact layer 206 and the stress layer 202 can be smooth, so the performance of the stress layer 202 and the electrical contact layer 206 can be further improved. In addition, the contact resistance between the stress layer 202 and the conductive structure can be reduced.

In Step S107 of FIG. 9 and referring to FIG. 8, after the annealing process, the remaining metal layer 205 (as shown in FIG. 7) and the second mask layer 208 (as shown in FIG. 7) are removed. After the remaining metal layer 205 is removed, a conductive structure 207 can be formed on the surface of the electrical contact layer 206. A process as depicted in FIGS. 6-7 for forming the electrical contact layer 206 can be referred to as a salicide process.

A process for removing the metal layer 205 and the second mask layer 208 can include a dry etching process and/or a wet etching process. In one embodiment, the process for removing the metal layer 205 and the second mask layer 208 can include a wet etching process. The wet etching process can have a desired etching selectivity, and may result in relatively minor damage to the electrical contact layer 206, the substrate 200, and the gate structure 201.

For example, a process for forming the conductive structure 207 can include the following steps. A dielectric layer (not labeled) can be formed on the surface of the electrical contact layer 206, the surface of the substrate 200, and the surface of the gate structure 201. The surface of the dielectric layer can be higher than or equal to (i.e., leveled with) the top surface of the gate structure 201. The surface of the dielectric layer can be flat and smooth.

The dielectric layer can be made of a material containing silicon oxide, silicon nitride, silicon oxynitride, low-K dielectric material(s), or a combination thereof. A portion of the dielectric layer can be etched, to form opening(s) in the dielectric layer that expose the electrical contact layer 206 at the surface of the stress layer 202, i.e., the electrical contact layer 206 at the top portion of the stress layer 202. A conductive material can be filled in the opening, to form the conductive structure 207. After the conductive material is filled, the conductive material on the surface of the dielectric layer can be removed by a chemical mechanical polishing process.

Because the electrical contact 206 contains the first metal element layer that has a low resistivity, the contact layer 206 can have a relatively low resistivity. Thus, the contact resistance between the conductive structure 207 and the stress layer 202 can be relatively low, which can cause the current between the source region and the drain region to increase. Therefore, the leakage current can be reduced, i.e., relatively reduced.

In one embodiment, the electrical contact layer 206 can contain aluminum atoms. The carbon ions doped in the barrier layer 204 can block the passing of the aluminum atoms, to prevent the aluminum atoms from diffusing to the bottom of the stress layer 202. Thus, the electrical contact layer 206 and the stress layer 202 can have desired performance. Moreover, the barrier layer can also contain an amorphous region formed by doping germanium ions. The amorphous region can cause nickel atoms or cobalt atoms to move toward the bottom of the stress layer 202 at a uniform moving speed. Accordingly, the thickness of the formed electrical contact layer 206 can be uniform. Further, the contact interface between the electrical contact layer 206 and the stress layer 202 can be smooth, and the formed electrical contact layer 206 can have desired properties.

In the methods as disclosed in various embodiments, before an electrical contact layer is formed using a salicide process, barrier ions can be doped in a stress layer, to form a barrier layer in the stress layer. The barrier layer can prevent atoms for subsequently forming an electrical contact layer from diffusing toward the bottom of the stress layer.

The electrical contact layer can contain a first metal element. The resistivity of the first metal element can be lower than the resistivity of nickel or cobalt. Therefore, the resistivity of the formed electrical contact layer can be reduced. The current between the source region and the drain region of the formed transistor can be improved, to improve the carrier mobility in the channel region, and reduce leakage current. However, when the resistivity of the first metal element is lower than the resistivity of nickel or cobalt, the first metal element can have a relative strong activity and tend to diffuse in the stress layer in a high-temperature environment.

The barrier layer can prevent the atoms of the first metal element from diffusing toward the bottom of the stress layer, such that the atoms of the first metal element can be concentrated in the portion of the stress layer above (i.e., higher than) the barrier layer. Therefore, the formed electrical contact layer can be located on the surface of the barrier layer. That is, the barrier layer can define the thickness of the electrical contact layer, prevent the atoms of the first metal element from diffusing, and ensure that the electrical contact layer can have a relatively low resistivity.

In addition, the thickness of the formed electrical contact layer can be uniform and can be controlled accurately and precisely. As a result, the carrier mobility in the channel region can be improved, electrical leakage can be reduced, and performance of the formed transistor can be improved.

In addition, although an N-type transistor is used in the above description, a P-type or any appropriate type of transistor can be formed using the processes and materials as disclosed above with appropriate modifications or adjustments, without limitation.

Various embodiments also provide semiconductor devices. An exemplary semiconductor device can include a transistor, e.g., as shown in FIG. 8. The transistor can include a substrate, a gate structure on the substrate, and stress layers in the substrate on both sides of the gate structure. The stress layer can have a barrier layer within the stress layer. The barrier layer can include doped barrier ions. The barrier layer can have a preset distance from the top surface of the stress layer.

An electrical contact layer can be formed using the portion of the stress layer on the barrier layer, by a salicide process. The electrical contact layer can contain a first metal element. The first metal element can have a resistivity lower than the resistivity of nickel or cobalt. The barrier layer can prevent atoms of the first metal element from diffusing to the bottom of the stress layer. The transistor can be further detailed in various disclosed embodiments, e.g., as shown in FIGS. 2-8.

In certain embodiments, a method for forming a transistor is provided herein. A substrate can be provided. A gate structure can be formed on the substrate. One or more stress layers can be formed in the substrate on both sides of the gate structure. Optionally, a source region and a drain region can be formed in the stress layers and in the portion of the substrate on the both sides of the gate structure, using an implant process. Optionally, the source region and the drain region can be activated using an annealing process.

A pre-silicide implant process can then be performed, to form a barrier layer within the stress layer. The pre-silicide implant process can include a germanium PAI process and a carbon implant process. The germanium PAI process can be performed before the carbon implant process. Alternatively, The germanium PAI process and the carbon implant process can be performed simultaneously.

Next, a silicide process or a salicide process can be performed. A nickel film (i.e., a metal layer) can be deposited on the stress layer using a sputter process. Aluminum can be co-sputtered during the sputter process. By the silicide process or the salicide process, nickel silicide (NiSi) containing aluminum, i.e., Ni(Al)Si, can be formed in the stress layer. The silicide layer can be formed using the portion of the stress layer above the barrier layer. Optionally, the remaining nickel film after the silicide process can be selectively etched. Optionally, aluminum atoms in the metal layer can have an atomic percent concentration ranging from about 0.01% to about 1%.

Optionally, the stress layers can be made of SiC. The disclosed method can reduce contact resistance on the source region and the drain region that have the stress layers.

Optionally, the germanium PAI process can have an implantation energy ranging from about 2 KeV to about 20 KeV, a doping concentration ranging from about 1E14 atoms/$cm^3$ to about 5E15 atoms/$cm^3$, and an implantation angle perpendicular to the surface of the substrate.

Optionally, the carbon implant process can have an implantation energy ranging from about 1 KeV to about 10 KeV, a doping concentration ranging from about 1E14 atoms/$cm^3$ to about 5E15 atoms/$cm^3$, and an implantation angle perpendicular to the surface of the substrate.

Figure 10:
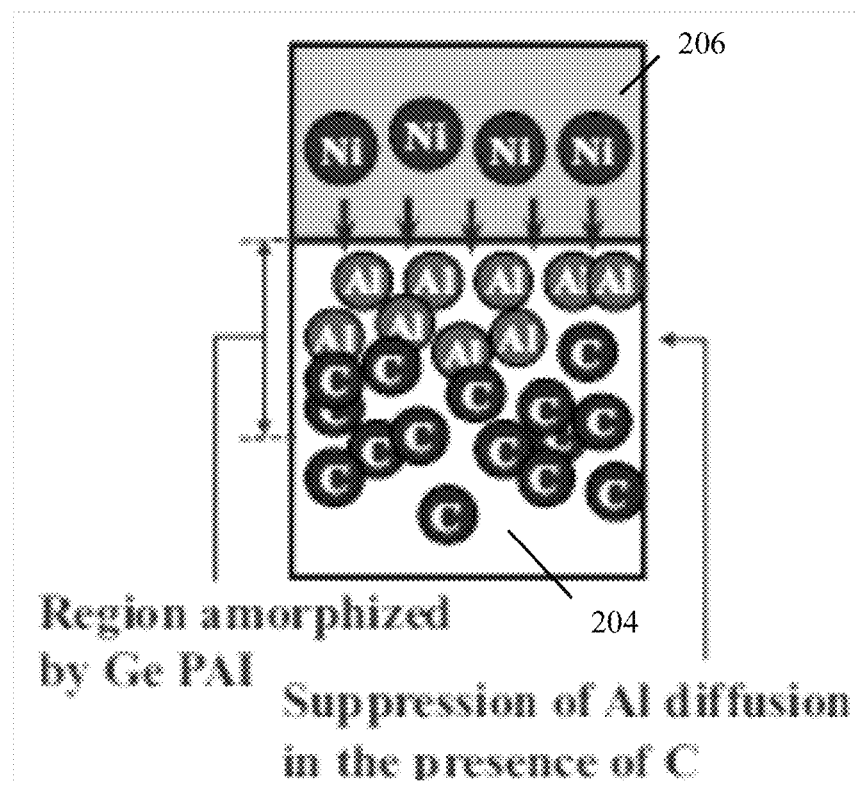
FIG. 10 depicts atoms in an exemplary transistor during a fabrication process in accordance with various disclosed embodiments.

The germanium PAI can form an amorphous layer in the barrier layer to better control the thickness of the NiSi layer and the roughness at the interface between nickel silicide and the stress layer. FIG. 10 depicts atoms in an exemplary transistor during a fabrication process in accordance with various disclosed embodiments. In particular, FIG. 10 illustrates a barrier layer 204 and an electrical contact layer 206 above the barrier layer 204, during the silicide process. As shown in FIG. 10, a top region of the barrier layer 204 forms a germanium amorphous layer. During the silicide process, the nickel atoms from the metal film can form nickel silicide in and/or above the germanium amorphous layer. The carbon atoms can suppress the diffusion of aluminum atoms toward the bottom of the stress layer.

Figure 11:
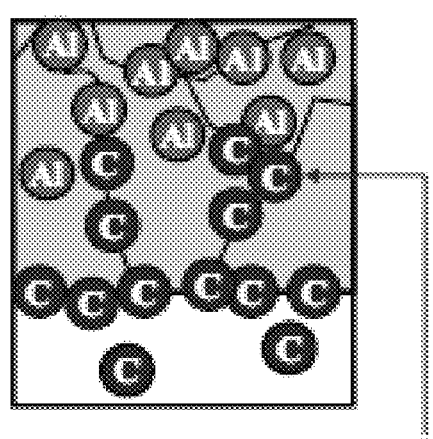
FIG. 11 depicts atoms in an exemplary transistor during a fabrication process in accordance with various disclosed embodiments.

FIG. 11 depicts atoms in an exemplary transistor during a fabrication process in accordance with various disclosed embodiments. In particular, FIG. 11 illustrates an interface between the barrier layer 204 and the electrical contact layer 206 above the barrier layer 204 during the silicide process. As shown in FIG. 11, the carbon implant process can help carbon atoms to diffuse into the grain boundaries in nickel silicide, to retard the movement of aluminum atoms along NiSi grain boundaries toward the interface between nickel silicide and the stress layer during the silicide process. Thus, aluminum can be co-sputtered together with the nickel film to form Ni(Al)Si. Aluminum atoms can be retained in the nickel silicide layer because carbon atoms already exist in the grain boundaries. That is, the carbon atoms can enhance the thermal stability of the Ni(Al)Si.

Figure 12:
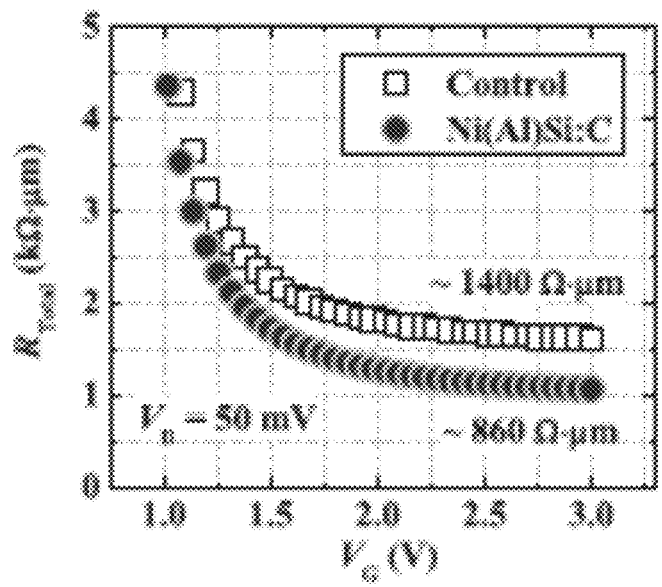
FIG. 12 depicts electrical characteristics of an exemplary transistor and a control device.
Figure 13:
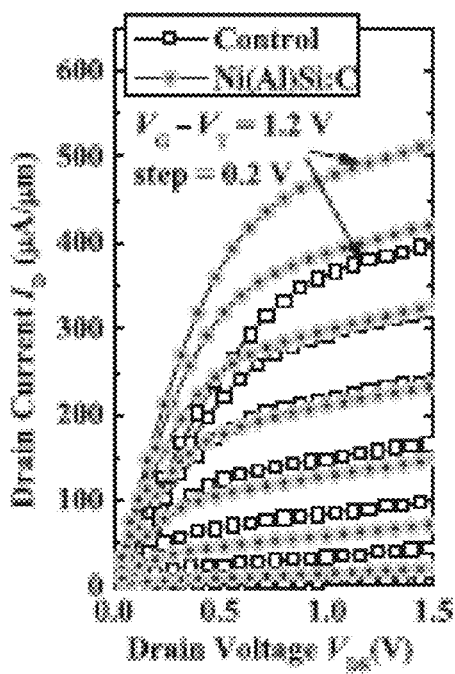
FIG. 13 depicts electrical characteristics of an exemplary transistor and a control device.

Further, aluminum atoms can be retained in the nickel silicide layer to form Ni(Al)Si, which can be effective to reduce the contact resistance of the source region and the drain region that have the stress layers containing SiC. For example, FIGS. 12-13 depict electrical characteristics of an exemplary transistor and a control device. In particular, FIG. 12 depicts a resistivity between a source region and a drain region of an exemplary transistor and a control device (i.e., a conventional transistor), as a function of a gate voltage. In particular, FIG. 13 depicts a drain current as a function of a drain voltage at various gate voltages, of an exemplary transistor and a control device. As shown in FIG. 12, a transistor having an electrical contact layer containing Ni(Al)Si and having a barrier layer containing carbon has a lower resistivity between the source region and the drain region, compared with a control device. As shown in FIG. 13, a transistor having an electrical contact layer containing Ni(Al)Si and having a barrier layer containing carbon has a greater drain current than a control device.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a transistor, comprising:
providing a substrate;
forming a gate structure on the substrate;
forming a stress layer in the substrate on both sides of the gate structure;
doping barrier ions in the stress layer to form a barrier layer in the stress layer, wherein the barrier layer has a preset distance from a surface of the stress layer; and
forming an electrical contact layer using a portion of the stress layer on the barrier layer by a salicide process, the electrical contact layer containing a first metal element, the first metal element having a resistivity lower than a resistivity of a silicidation metal, wherein the barrier layer prevents atoms of the first metal element from diffusing to a bottom of the stress layer.

2. The method according to claim 1, wherein the barrier ions contain carbon ions, and the forming of the barrier layer includes:
performing a carbon-containing ion implantation process on the stress layer, ions doped by the carbon-containing ion implantation process containing the carbon ions, an implantation depth of the carbon ions being a preset depth.

3. The method according to claim 2, wherein the carbon-containing ion implantation process has an implantation energy ranging from about 1 KeV to about 10 KeV, a doping concentration ranging from about 1E14 atoms/cm$^3$ to about 5E15 atoms/cm$^3$, and an implantation angle perpendicular to a surface of the substrate.

4. The method according to claim 2, wherein the barrier ions further contain germanium ions, and the forming of the barrier layer further includes:
performing a germanium-containing ion implantation process on the stress layer, ions doped by the germanium-containing ion implantation process containing the germanium ions, an implantation depth of the germanium ions being the preset depth, wherein the germanium-containing ion implantation process includes a pre-amorphization implant (PAI) process.

5. The method according to claim 4, wherein the germanium-containing ion implantation process has an implantation energy ranging from about 2 KeV to about 20 KeV, a doping concentration ranging from about 1E14 atoms/cm$^3$ to about 5E15 atoms/cm$^3$, and an implantation angle perpendicular to a surface of the substrate.

6. The method according to claim 1, wherein the first metal element is copper, tungsten, aluminum, or a combination thereof.

7. The method according to claim 6, wherein the salicide process includes:
forming a second mask layer on the substrate, the second mask layer exposing at least the surface of the stress layer;
forming a metal layer on the second mask layer and on the stress layer;
diffusing metal atoms in the metal layer into the stress layer by using an annealing process, to form an electrical contact layer on a surface of the barrier layer; and
after the annealing process, removing the metal layer that remains.

8. The method according to claim 7, wherein the metal layer is made of a material containing the first metal element.

9. The method according to claim 8, wherein, when the first metal element is aluminum, the metal layer contains aluminum atoms that have an atomic percent concentration ranging from about 0.01% to about 1%.

10. The method according to claim 8, wherein the metal layer is further made of a material containing the silicidation metal, and the silicidation metal is nickel, cobalt, or a combination thereof.

11. The method according to claim 10, wherein, when the first metal element is aluminum, the electrical contact layer is made of a material containing one or both of Ni(Al)Si and Co(Al)Si.

12. The method according to claim 1, wherein the stress layer is made of a material containing SiC, and the gate structure is used for forming an NMOS transistor.

13. The method according to claim 1, wherein the forming of the stress layer includes:
forming a first mask layer on the substrate and the gate structure, the first mask layer exposing a portion of the substrate at the both sides of the gate structure;

etching the substrate using the first mask layer as an etching mask, to form an opening in the substrate; and forming the stress layer within the opening by a selective epitaxial deposition process.

14. The method according to claim 13, wherein the opening has a sidewall perpendicular to a surface of the substrate, and the opening is formed using an anisotropic dry etching process.

15. The method according to claim 13, wherein the opening has a sidewall forming a "Σ" shape with a surface of the substrate, the sidewall having an angle, the angle extending toward within the substrate at a bottom of the gate structure, and the forming of the opening includes:

etching the substrate using an anisotropic dry etching process, using the first mask layer as the etching mask, to form the opening in the substrate, the opening having a sidewall perpendicular to the surface of the substrate; and after the anisotropic dry etching process, etching both of the sidewall and a bottom of the opening using an anisotropic wet etching process, using the first mask layer as the etching mask, to cause the sidewall of the opening to form the "Σ" shape with the surface of the substrate.

16. The method according to claim 1, wherein the gate structure includes a gate dielectric layer on the substrate, a gate electrode layer on the gate dielectric layer, and sidewall spacers on sidewalls of both of the gate electrode layer and the gate dielectric layer and on the surface of the substrate.

17. The method according to claim 1, further including:

forming a source region and a drain region in both of the stress layer and a portion of the substrate on the both sides of the gate structure; and after forming the electrical contact layer, forming a conductive structure on the electrical contact layer.

18. A transistor, comprising:

a substrate;

a gate structure on the substrate;

a stress layer in the substrate on both sides of the gate structure;

a barrier layer in the stress layer, the barrier layer including doped barrier ions, the barrier layer having a preset distance from a surface of the stress layer; and an electrical contact layer formed using a portion of the stress layer on the barrier layer by a salicide process, the electrical contact layer containing a first metal element, the first metal element having a resistivity lower than a resistivity of a silicidation metal, wherein the barrier layer prevents atoms of the first metal element from diffusing to a bottom of the stress layer.

19. The device according to claim 18, wherein:

the barrier ions contain carbon ions; and the first metal element is copper, tungsten, aluminum, or a combination thereof; and the silicidation metal is nickel, cobalt, or a combination thereof.

20. The device according to claim 18, further including:

a source region and a drain region in both of the stress layer and a portion of the substrate on the both sides of the gate structure.

* * * * *